US012635496B2

(12) United States Patent
Tien et al.

(10) Patent No.: US 12,635,496 B2
(45) Date of Patent: May 19, 2026

(54) SEMICONDUCTOR DEVICE INCLUDING INTERCONNECTS WITH LOWER CONTACT RESISTANCE

(71) Applicant: TAIWAN SEMICONDUCTOR MANUFACTURING COMPANY, LTD., Hsinchu (TW)

(72) Inventors: Hsi-Wen Tien, Hsinchu (TW); Hwei-Jay Chu, Hsinchu (TW); Chia-Tien Wu, Hsinchu (TW); Yung-Hsu Wu, Hsinchu (TW); Wei-Hao Liao, Hsinchu (TW); Yu-Teng Dai, Hsinchu (TW); Hsin-Chieh Yao, Hsinchu (TW); Hsin-Ping Chen, Hsinchu (TW); Chih-Wei Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 552 days.

(21) Appl. No.: 17/825,741

(22) Filed: May 26, 2022

(65) Prior Publication Data

US 2023/0387022 A1 Nov. 30, 2023

(51) Int. Cl.
*H01L 23/535* (2006.01)
*H01L 21/768* (2006.01)
*H01L 23/528* (2006.01)

(52) U.S. Cl.
CPC ...... *H01L 23/535* (2013.01); *H01L 21/76805* (2013.01); *H01L 21/76895* (2013.01); *H01L 23/5283* (2013.01)

(58) Field of Classification Search
CPC .............. H01L 23/535; H01L 23/5283; H01L 23/5538; H01L 23/5384; H01L 21/76805; H01L 21/76895; H01L 21/76897; H01L 21/76831; H01L 21/76811; H01L 21/76804; H01L 21/76813; H01L 21/76816; H01L 2224/05085–05098; H01L 2224/05012; H01L 2224/05015; H01L 23/49822; H01L 23/49827; H01L 23/49816; H01L 23/52; H01L 23/5226; H01L 23/5286; H01L 23/5386
USPC .......................................... 257/774, 762, 751
See application file for complete search history.

(56) References Cited

U.S. PATENT DOCUMENTS

| | | | | |
|---|---|---|---|---|
| 6,150,723 A | * | 11/2000 | Harper | .............. H01L 21/76844 257/E21.585 |
| 9,887,126 B2 | * | 2/2018 | Peng | ................. H01L 21/76808 |
| 2007/0117371 A1 | * | 5/2007 | Engbrecht | ......... H01L 21/76844 438/622 |
| 2017/0194247 A1 | * | 7/2017 | Chang | ............... H01L 21/76832 |
| 2019/0097007 A1 | * | 3/2019 | Ahn | ..................... H10D 64/514 |

(Continued)

*Primary Examiner* — Natalia A Gondarenko
(74) *Attorney, Agent, or Firm* — Birch, Stewart, Kolasch & Birch, LLP

(57) ABSTRACT

A semiconductor device includes a substrate, an interconnect layer disposed over the substrate and including a metal line, and a dielectric layer disposed on the interconnect layer and including a via contact. The via contact is electrically connected to the metal line and has a first dimension in a first direction greater than a second dimension in a second direction. The first direction and the second direction are perpendicular to each other, and are both perpendicular to a longitudinal direction of the via contact.

20 Claims, 14 Drawing Sheets

(56)                    References Cited

U.S. PATENT DOCUMENTS

2020/0365451 A1* 11/2020 Tien .................. H01L 21/76811
2023/0056343 A1*  2/2023 Nakae .............. H01L 21/76816

* cited by examiner

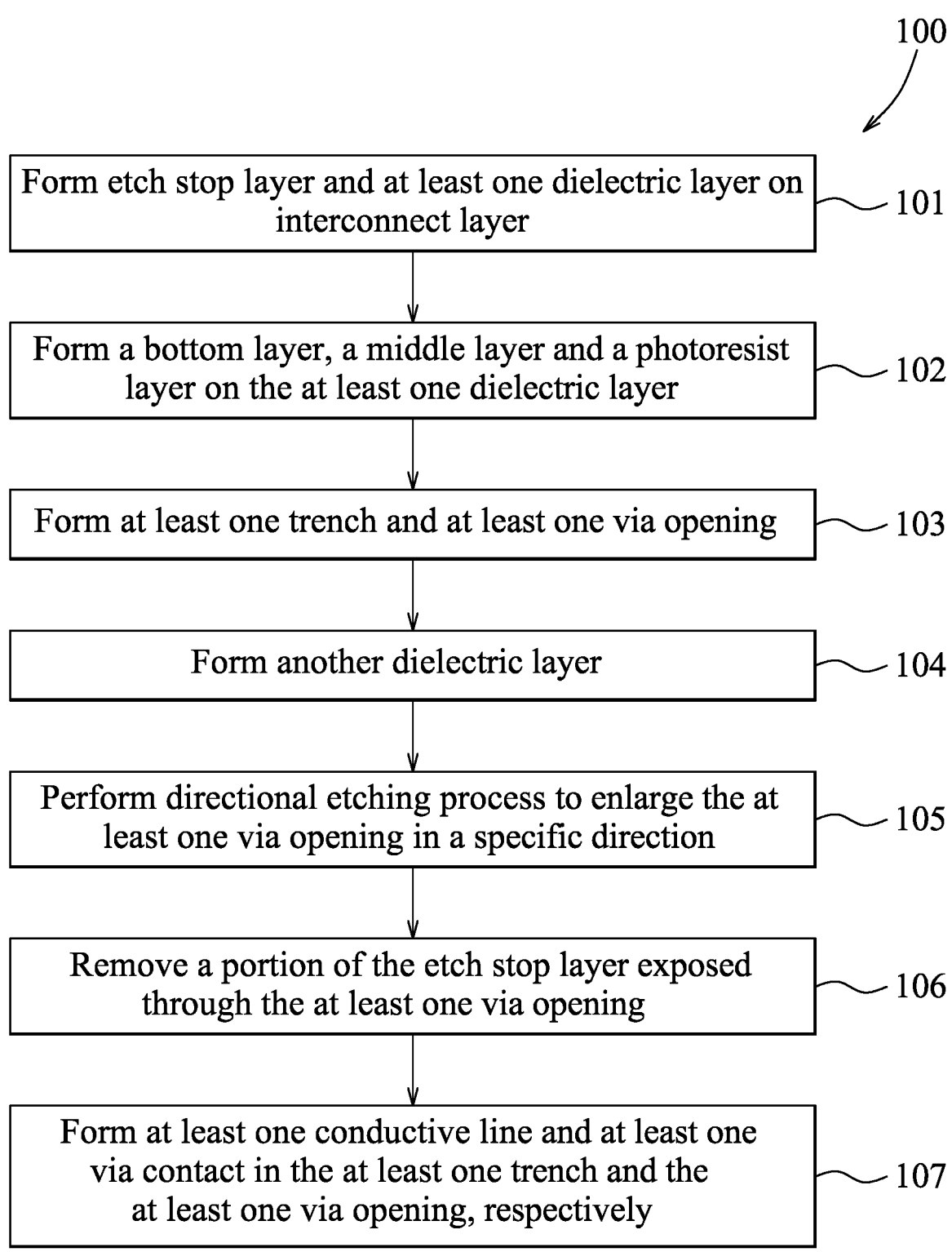

100

Form etch stop layer and at least one dielectric layer on interconnect layer — 101

Form a bottom layer, a middle layer and a photoresist layer on the at least one dielectric layer — 102

Form at least one trench and at least one via opening — 103

Form another dielectric layer — 104

Perform directional etching process to enlarge the at least one via opening in a specific direction — 105

Remove a portion of the etch stop layer exposed through the at least one via opening — 106

Form at least one conductive line and at least one via contact in the at least one trench and the at least one via opening, respectively — 107

SEMICONDUCTOR DEVICE INCLUDING INTERCONNECTS WITH LOWER CONTACT RESISTANCE

BACKGROUND

With the advancement of semiconductor manufacturing processes, components on chips have smaller sizes and tighter spacing, that is, decreasing in feature size and increasing in transistor density, which allow for cost reduction and performance improvement in semiconductor devices. As the feature size decreases, the dimensions and pitches of interconnects (i.e., metal lines, conductive lines and/or via contacts) for interconnecting these components are scaled down as well, which leads to higher contact resistance between these interconnects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow diagram illustrating a method for manufacturing a semiconductor device in accordance with some embodiments.

DETAILED DESCRIPTION

Figure 2:
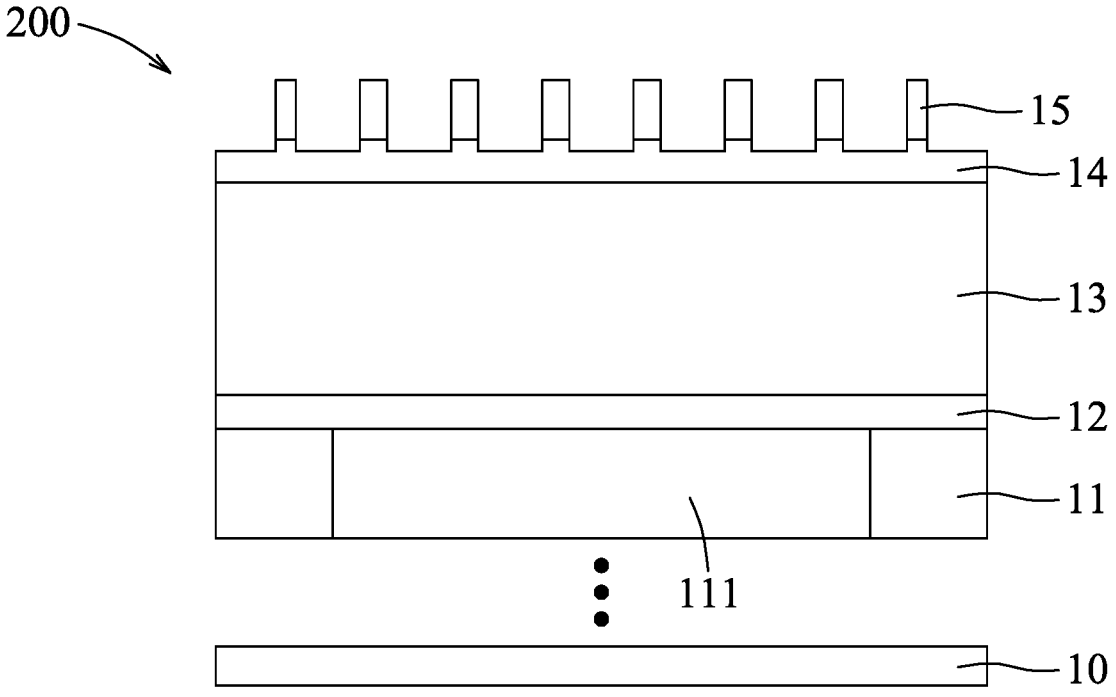
FIGS. 2 to 14 are schematic views illustrating some intermediate stages of the manufacturing method as depicted in FIG. 1 in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "upper," "lower," "downwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor device including a via contact enlarged in a specific direction, and a method for manufacturing the same. FIG. 1 illustrates a method 100 for manufacturing a semiconductor device in accordance with some embodiments. FIGS. 2 to 14 are schematic views of a semiconductor device 200 in accordance with some embodiments at some intermediate stages of the manufacturing method as depicted in FIG. 1. Additional steps can be provided before, after or during the method 100, and some of the steps described herein may be replaced by other steps or be eliminated. Similarly, further additional features may be present in the semiconductor device 200, and/or features present may be replaced or eliminated in additional embodiments.

Referring to FIG. 1 and the example illustrated in FIG. 2, the method 100 begins at step 101, where an etch stop layer and at least one dielectric layer are formed sequentially on an interconnect layer. FIG. 2 is a schematic view illustrating formation of an etch stop layer 12, a first dielectric layer 13 and a second dielectric layer 14 sequentially on an interconnect layer 11 which is disposed over a substrate 10. The interconnect layer 11 includes at least one metal line 111. The second dielectric layer 14 is patterned through a mask layer 15 (for example, a hard mask layer).

In some embodiments, the substrate 10 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor structure. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorous (P), or arsenic (As). Other suitable materials are within the contemplated scope of the present disclosure. In some embodiments, the semiconductor substrate may further include various active regions, for example, the active regions configured for an N-type metal oxide semiconductor transistor device (NMOS) or the active regions configured for a P-type metal oxide semiconductor transistor device (PMOS).

In some embodiments, the interconnect layer 11 may include dielectric materials, such as silicon oxide (SiOx), silicon nitride (SiNx), silicon carbide (SiCx), silicon oxy-carbide (SiOxCy), silicon oxynitride (SiOxNy), hydroge-nated silicon oxycarbide (SiOxCyHz), spin-on glass (SOG), amorphous fluorinated carbon, fluorinated silica glass (FSG), Black Diamond® (Applied Materials Inc., Santa Clara, Calif.), Xerogel, Aerogel, polyimide, Parylene, BCB (bis-benzocyclobutenes), Flare, SiLK™ (Dow Chemical Co., Midland, Mich.), non-porous materials, porous mate-rials, other low-k dielectric materials, or combinations thereof. Other suitable materials are within the contemplated scope of the present disclosure. In some embodiments, the interconnect layer 11 may have a k-value ranging from about 1 to about 5. In some embodiments, the interconnect layer 11 may be formed by a suitable deposition process known to those skilled in the art of semiconductor fabrication, for example, but not limited to, chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), or low-pres-sure chemical vapor deposition (LPCVD). Other suitable techniques for forming the interconnect layer 11 are within the contemplated scope of the present disclosure.

In some embodiments, the at least one metal line 111 may be formed in the interconnect layer 11 by patterning the interconnect layer 11 to form a trench, filling a metal material into the trench, and performing a planarization treatment (for example, using chemical mechanical planar-ization, CMP) to remove excess of the metal material over the interconnect layer 11. The trench may be formed using a suitable etching process, for example, but not limited to, a plasma etching process, a sputter etching process, a reactive ion etching process, a deep-reactive ion etching process, or the like, so as to pattern the interconnect layer 11 and to form the trench. The metal material is filled into the trench by a suitable deposition process as is known to those skilled in the art of semiconductor fabrication, for example, PVD, selective or non-selective CVD, selective or non-selective PECVD, selective or non-selective ALD, selective or non-selective plasma-enhanced ALD (PEALD), electroless deposition (ELD), electro-chemical plating (ECP), or the like.

In some embodiments, the etch stop layer 12 may be formed on the interconnect layer 11 by a suitable deposition process as is known in the art of semiconductor fabrication, such as PVD, CVD, ALD, PEALD, thermal ALD, PECVD, spin on coating, or the like. The deposition process may be performed at a temperature ranging from about 20° C. to about 400° C. The etch stop layer 12 may include silicon nitride, silicon nitride doped with carbon, silicon oxide, silicon oxynitride, silicon oxynitride doped with carbon, amorphous carbon material, silicon carbide, silicon oxycar-bide, other nitride materials, other carbide materials, alumi-num oxide, other metal oxides, aluminum nitride, aluminum oxynitride, other metal nitrides (e.g., titanium nitride, or the like), boron nitride, boron carbide, other low-k dielectric materials or low-k dielectric materials doped with one or more of carbon, nitrogen, and hydrogen, or other suitable materials. The etch stop layer 12 may have a thickness ranging from about 10 angstrom (Å) to about 1000 Å. In some embodiments, the etch stop layer 12 may include a stack assembly of multiple etch stop layers.

In some embodiments, the first dielectric layer 13 may be formed on the etch stop layer 12 by a suitable deposition process as is known in the art of semiconductor fabrication, such as PVD, CVD, ALD, spin on coating, or the like. The deposition process may be performed at a temperature ranging from about 20° C. to about 400° C. The first dielectric layer 13 may include silicon nitride, silicon nitride doped with carbon, silicon oxide, silicon oxynitride, silicon oxynitride doped with carbon, silicon carbide, silicon oxy-carbide, or other suitable materials. The first dielectric layer 13 may have a thickness ranging from about 30 Å to about 800 Å.

In some embodiments, the material and the process for forming the second dielectric layer 14 may be the same as or similar to those for forming the first dielectric layer 13 described above, and the details thereof are omitted for the sake of brevity. The second dielectric layer 14 may have a thickness ranging from about 30 Å to about 800 Å. The mask layer 15 that is used to pattern the second dielectric layer 14 is deposited on the second dielectric layer 14. A material suitable for forming the mask layer 15 includes, for example, but not limited to, silicon oxide, silicon nitride, silicon carbide, silicon oxycarbide, silicon oxynitride, sili-con carbonitride, silicon oxycarbonitride, tungsten, tungsten nitride, tungsten carbide, titanium nitride, titanium oxide, zirconium oxide, zinc oxide, aluminum oxide, yttrium oxide, aluminum oxynitride, hafnium oxide, hafnium zirco-nium oxide, titanium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, and combinations thereof. Other suitable materials are within the contemplated scope of the present disclosure. The mask layer 15 may be formed on the second dielectric layer 14 by a suitable deposition process as is known in the art of semiconductor fabrication, such as PVD, CVD, ALD, PEALD, thermal ALD, PECVD, or the like. The deposition process may be performed at a temperature ranging from about 50° C. to about 400° C. Other suitable techniques are within the contemplated scope of the present disclosure. In some embodiments, the mask layer 15 has a thickness ranging from about 30 Å to about 500 Å. The mask layer 15 is formed with a pattern of recesses. The pattern of the recesses formed in the mask layer 15 is transferred to the second dielectric layer 14 using a suitable etching process, for example, but not limited to, a plasma etching process, a sputter etching process, a reactive ion etching process, a deep-reactive ion etching process, or the like, so as to pattern the second dielectric layer 14.

Figure 3:
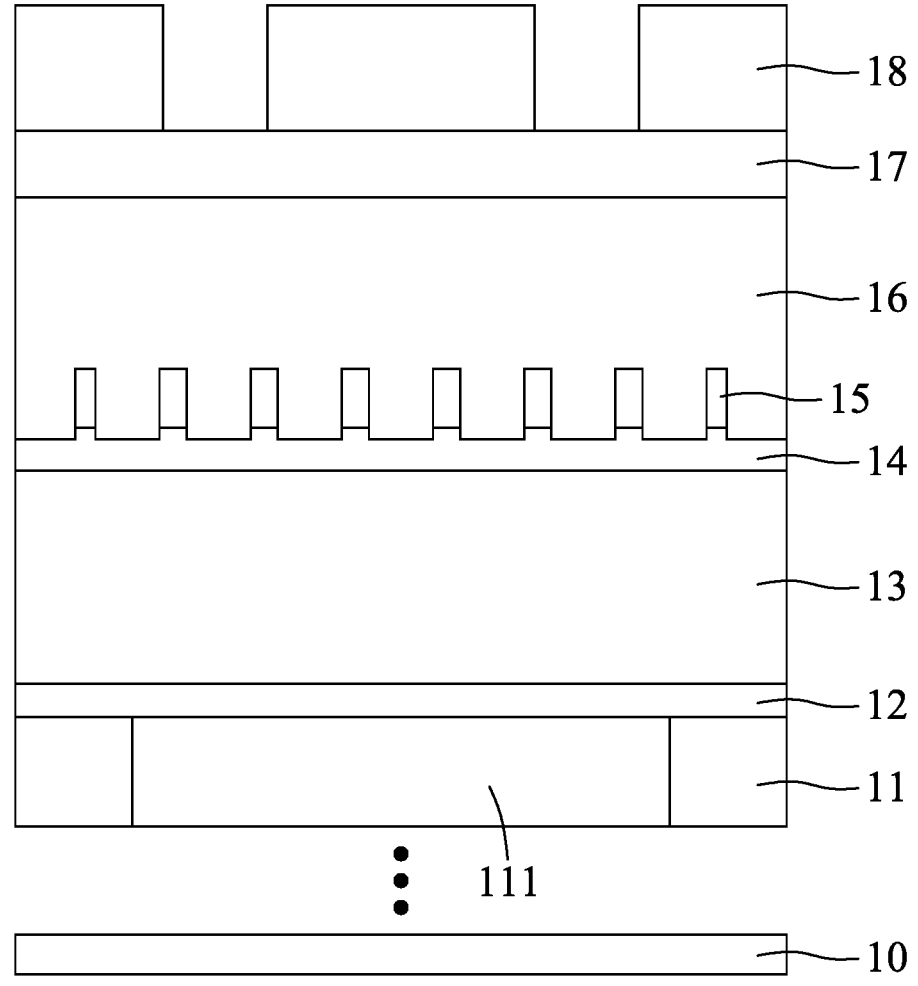

Referring to FIG. 1 and the example illustrated in FIG. 3, the method 100 then proceeds to step 102, where a bottom layer, a middle layer and a photoresist layer are formed sequentially on the at least one dielectric layer. A bottom layer 16 is deposited on the mask layer 15 and the second dielectric layer 14, a middle layer 17 is then deposited on the bottom layer 16, and finally a photoresist layer 18 is formed on the middle layer 17.

In some embodiments, the bottom layer 16 may be a spin-on carbon (SOC) layer. SOC is a high carbon contain-ing polymer which, when used as a coating material, is soluble in organic solvent to form a polymer solution and insoluble after curing for coating a surface. The middle layer 17 may be a bulk film or a silicon bulk which includes silicon and/or other suitable materials. The photoresist layer 18 is formed on the middle layer 17 by a suitable fabrication technique known to those skilled in the art of semiconductor fabrication, for example, but not limited to, a spin-on technique. Other suitable techniques are within the contemplated scope of the present disclosure. The photoresist layer 18 is then patterned using a suitable photolithography technique to form a pattern of recesses. For example, the photoresist layer 18 is exposed to light for patterning, followed by developing to form the pattern of the recesses (for example, two recesses as shown in FIG. 3).

Figure 4:
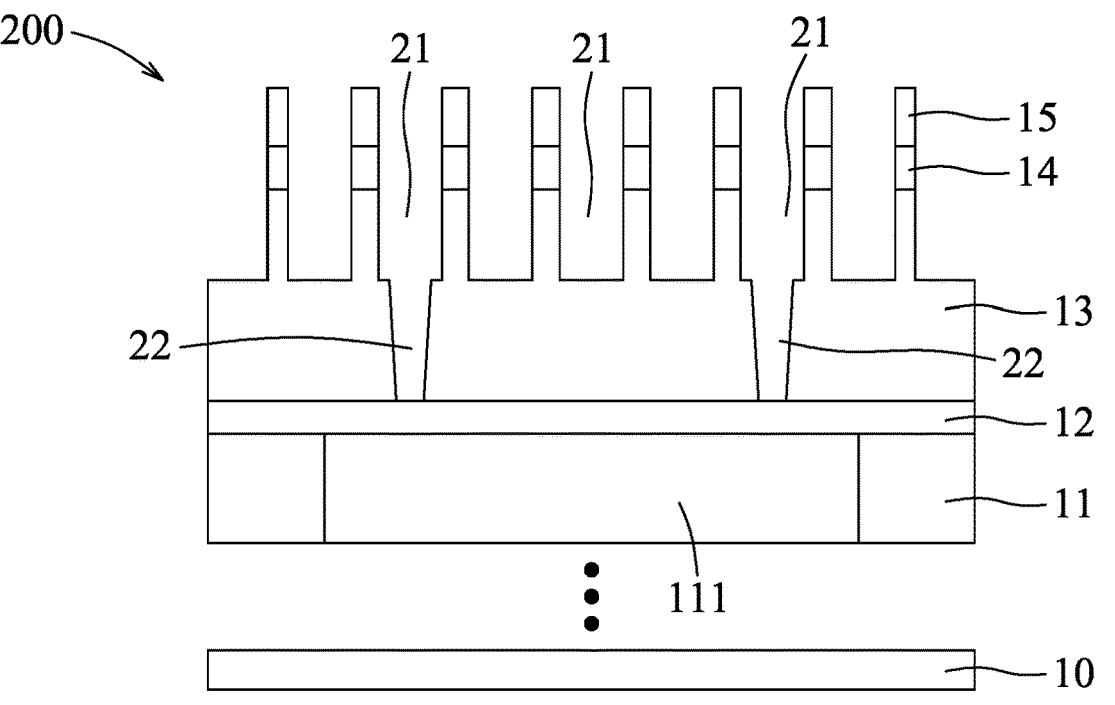
Figure 5:
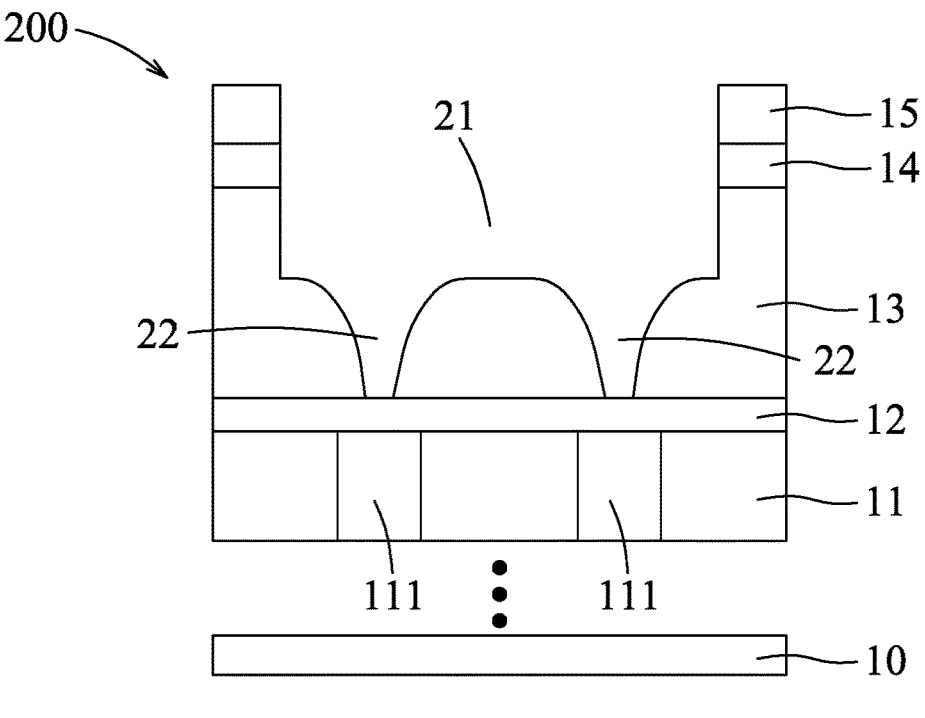

Referring to FIG. 1 and the example illustrated in FIGS. 4 and 5, the method 100 then proceeds to step 103, where at least one trench and at least one via opening are formed. In the example shown in FIG. 4, a plurality of via openings 22 (e.g., two via openings) and a plurality of trenches 21 are formed by patterning the second dielectric layer 14 and the first dielectric layer 13 using one or more etching processes through the pattern of the recesses formed in the photoresist layer 18 (see FIG. 3) and the pattern of the recesses formed in the mask layer 15 so as to expose portions of the etch stop layer 12 through the via openings 22 and corresponding ones of the trenches 21 connected to the via openings 22. The trenches 21 are recessed downwardly from a top surface of the second dielectric layer 14, and the via openings 22 extend from corresponding ones of the trenches 21 and reach the etch stop layer 12. The via openings 22 are disposed below and in spatial communication with the corresponding ones of the trenches 21, so as to expose the portions of the etch stop layer 12. FIG. 4 is a schematic view illustrating a cross-section of the semiconductor device 200 which is obtained by cutting the semiconductor device 200 along a cutting plane that is perpendicular to an extension direction of the trenches 21 (into the page in FIG. 4). FIG. 5 is a schematic view illustrating a cross-section of the semiconductor device 200 which is obtained by cutting the semiconductor device 200 along a cutting plane that is parallel to the extension direction of the trenches 21 and that passes through one of the trenches 21. A direction in which the trenches 21 are spaced apart from each other is defined as a cross-line direction (left-right direction of FIG. 4), and a direction perpendicular to the cross-line direction and parallel to the extension direction of the trenches 21 is defined as an along-line direction (left-right direction of FIG. 5).

Specifically, in some embodiments, the pattern of the recesses formed in the photoresist layer 18 (see FIG. 3) is transferred to the second dielectric layer 14 and then to the first dielectric layer 13 using one or more etching processes, for example, but not limited to, a wet etching process, a dry etching process, a reactive ion etching process, a neutral beam etching process, or the like, so as to form the via openings 22 that extend through the first dielectric layer 13 and that terminate at the etch stop layer 12. The photoresist layer 18, the middle layer 17 and the bottom layer 16 may be removed during said one or more etching processes which are performed for forming the via openings 22 or be removed by using an ashing process. Subsequently, the pattern of the recesses formed in the mask layer 15 is then transferred to the second dielectric layer 14 and then to an upper part of the first dielectric layer 13 using one or more etching processes, for example, but not limited to, a plasma etching process, a sputter etching process, a reactive ion etching process, a deep-reactive ion etching process, or the like, so as to form the trenches 21 that extend through the second dielectric layer 14 and terminate at the upper part of the first dielectric layer 13. Other suitable etching techniques are within the contemplated scope of the present disclosure. In some embodiments, reactive ion etching processes may be used to form the trenches 21 and the via openings 22. During each of the reactive ion etching processes, a reactive gas may include, for example, but not limited to, $CH_4$, $CH_3F$, $CH_2F_2$, $CHF_3$, $C_4F_8$, $C_4F_6$, $CF_4$, Hz, HBr, $O_2$, $BCl_3$, $Cl_2$, or the like, an additive gas may include, for example, but not limited to CO, $CO_2$, $O_2$, $N_2$, He, Ne, Ar, or the like, a process pressure may be set to be in a range from about 0.2 millitorrs to about 120 millitorrs, a process temperature may be set to be in a range from about 0° C. to about 180° C., a process power may be set to be in a range from about 0 watts to about 3000 watts, and a process bias voltage may be set to be in a range from about 0 volts to about 1200 volts. In some embodiments, each of the trenches 21 has a dimension in the cross-line direction ranging from about 5 nanometers to about 3000 nanometers; each of the via openings 22 has dimensions in the cross-line direction and the along-line direction that both range from about 5 nanometers to about 300 nanometers. In some embodiments, the aforementioned dimensions may be critical dimensions.

Figure 6:
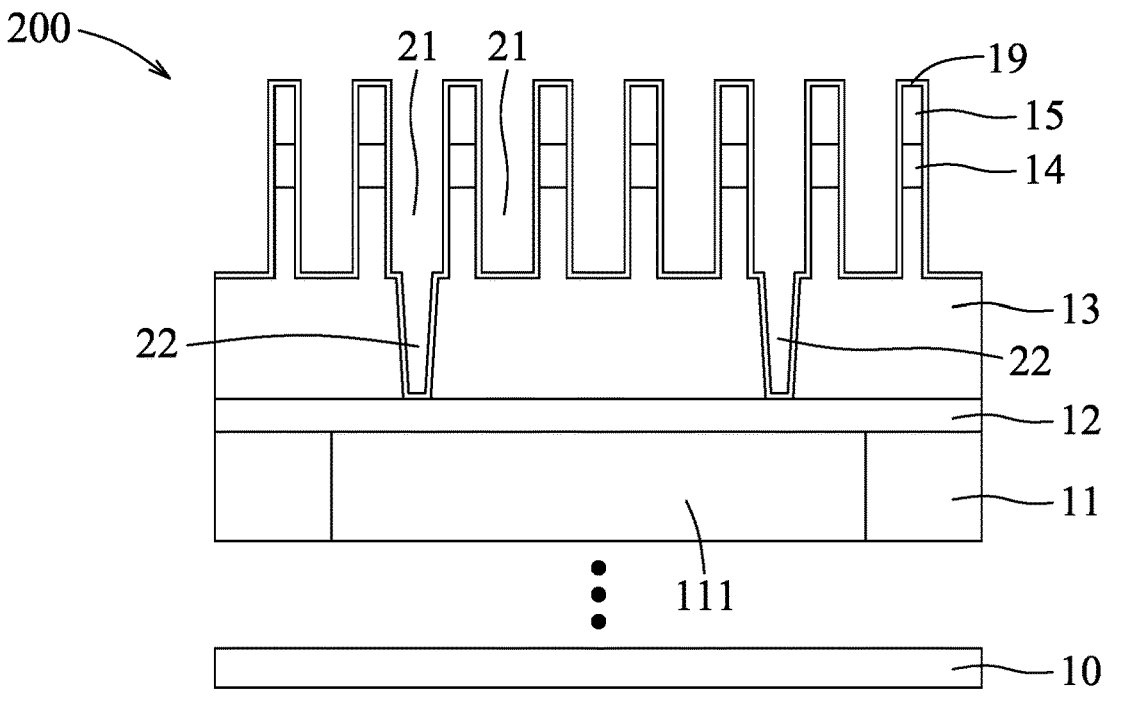
Figure 7:
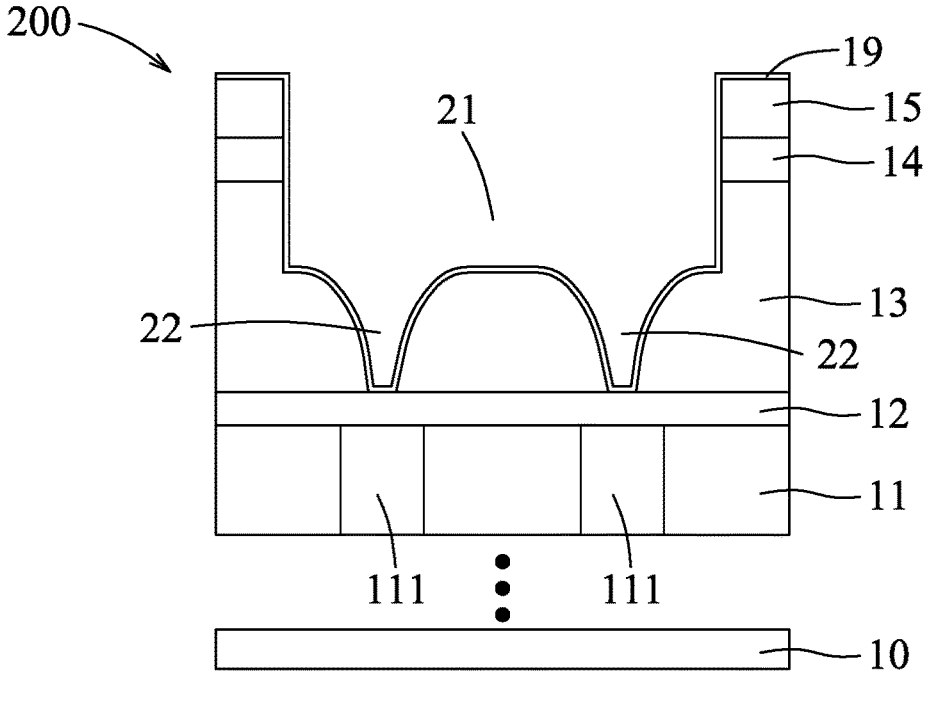

Referring to FIG. 1 and the example illustrated in FIGS. 6 and 7, the method 100 then proceeds to step 104, where another dielectric layer is formed. In the example shown in FIG. 6, a third dielectric layer 19 is formed by depositing a dielectric material on the mask layer 15, the second dielectric layer 14, the first dielectric layer 13, and the portions of the etch stop layer 12 exposed through the via openings 22 and corresponding ones of the trenches 21. In some embodiments, the dielectric material for forming the third dielectric layer 19 may include silicon nitride, silicon nitride doped with carbon, silicon oxide, silicon oxynitride, silicon oxynitride doped with carbon, silicon carbide, silicon oxycarbide, aluminum oxide ($AlO_X$), aluminum nitride, aluminum oxynitride, or other suitable materials. The third dielectric layer 19 may be formed by a suitable deposition process as is known in the art of semiconductor fabrication, such as CVD, ALD, or the like. The deposition process may be performed at a temperature ranging from about 20° C. to about 400° C. The third dielectric layer 19 may have a thickness ranging from about 5 Å to about 100 Å. In some embodiments, the third dielectric layer 19 may be conformally formed on the mask layer 15, the second dielectric layer 14, the first dielectric layer 13 and the portions of the etch stop layer 12. In other words, sidewalls of the second dielectric layer 14 and the first dielectric layer 13 which border the trenches 21 and the via openings 22 may be covered by the third dielectric layer 19. FIG. 6 is a schematic view illustrating a cross-section of the semiconductor device 200 obtained using the cutting plane of FIG. 4. FIG. 7 is a schematic view illustrating a cross-section of the semiconductor device 200 obtained using the cutting plane of FIG. 5.

Figure 8:
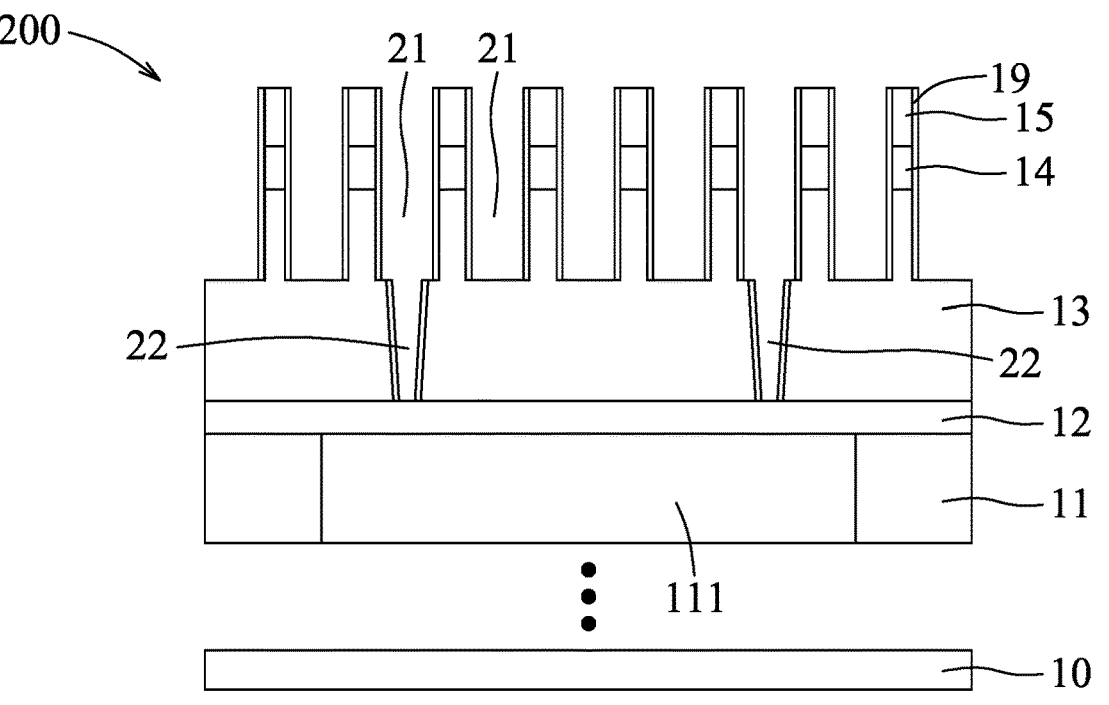
Figure 9:
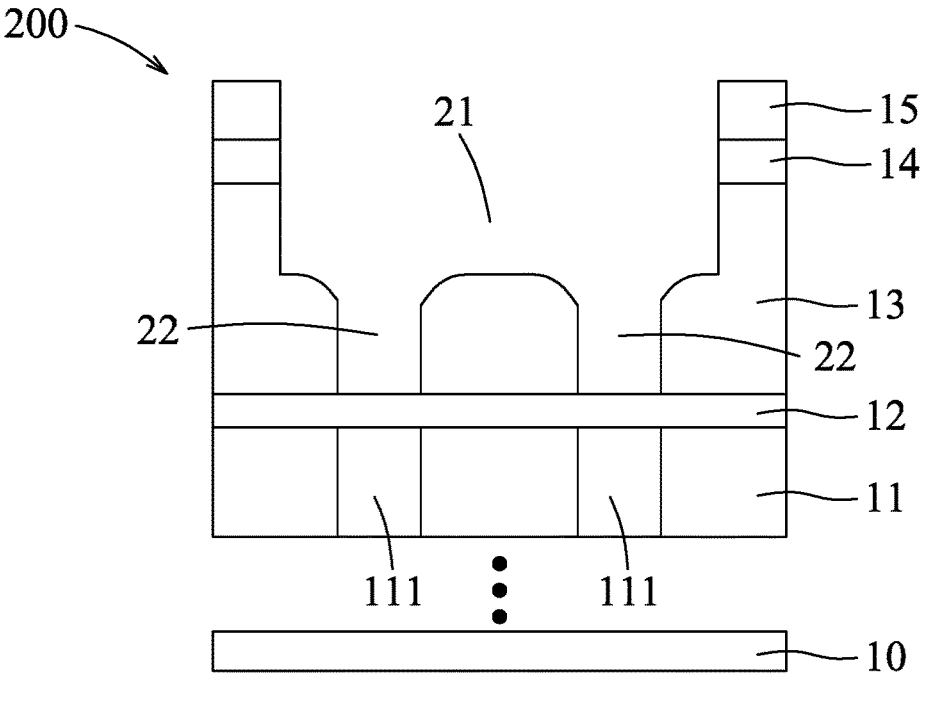

Referring to FIG. 1 and the example illustrated in FIGS. 8 and 9, the method 100 then proceeds to step 105, where a directional etching process is performed to enlarge the at least one via opening in a specific direction. In some embodiments, portions of the third dielectric layer 19 that correspond in position to the trenches 21 and the via openings 22, and that extend in the along-line direction are removed and portions of the sidewalls of the first dielectric layer 13 that border the via openings 22 in the along-line direction are etched back through the directional etching process, such that the dimension of each of the via openings 22 in the along-line direction is enlarged. In the example of FIG. 9 which is a schematic view illustrating a cross-section of the semiconductor device 200 obtained using the cutting plane of FIG. 5, the dimension of each of the via openings 22 in the along-line direction is enlarged in comparison with that as shown in FIG. 5. In some embodiments, each of the via openings 22 has the dimension enlarged in the along-line direction and ranging from about 8 nanometers to about 300 nanometers. On the other hand, because of the highly directional nature of the directional etching process, portions of the third dielectric layer 19 that are formed on the sidewalls of the first dielectric layer 13 and the second dielectric layer 14 in the cross-line direction are not etched (i.e., the third dielectric layer 19 is not fully etched in the cross-line direction), so that portions of the sidewalls of the first dielectric layer 13 that border the via openings 22 and that are covered by the portions of the third dielectric layer 19 in the cross-line direction are intact. In addition, the third dielectric layer 19 may serve as a buffer layer to protect the portions of the sidewalls of the first dielectric layer 13 from etching in the cross-line direction during the directional etching process. In the example of FIG. 8 which is a schematic view illustrating a cross-section of the semiconductor device 200 obtained using the cutting plane of FIG. 4, the dimension of each of the via openings 22 in the cross-line direction (the third dielectric layer 19 does not alter the dimension of the via openings 22) is unchanged in comparison with that as shown in FIG. 4. In some embodiments, the directional etching process includes ion beam etching, where an inert gas is introduced to an ion beam source, is ionized, and moves directionally (i.e., in the along-line direction) toward the semiconductor device 200 with high energy. The ions hit the portions of the third dielectric layer 19 and the portions of the sidewalls of the first dielectric layer 13 in the along-line direction, and the impact removes the materials of the third dielectric layer 19 and the first dielectric layer 13 so that the dimension of each of the via openings 22 in the along-line direction may be enlarged.

In some embodiments, with respect to the ion beam etching, the inert gas may include, for example, but not limited to, argon, neon, helium, krypton, xenon, or the like, an additive gas may include, for example, but not limited to $CO$, $CO_2$, $O_2$, $N_2$, or the like, a process pressure may be set to be in a range from about 0.2 millitorrs to about 60 millitorrs, a process temperature may be set to be in a range from about 0° C. to about 90° C., a process power may be set to be in a range from about 100 watts to about 1000 watts, and a process bias voltage may be set to be in a range from about 500 volts to about 3000 volts. However, the directional etching process is not limited to ion beam etching, and may be implemented by reactive ion beam etching or chemically assisted ion beam etching. In some embodiments where reactive ion beam etching is adopted, the reactive ion beam etching is similar to the ion beam etching described above, and the difference resides in that the inert gas to be introduced to the ion beam source is replaced by a reactive gas which includes, for example, but not limited to, $CH_XF_Y$, $C_XF_Y$, such as $CF_4$, $C_4F_6$, $C_4F_8$, or the like. In some embodiments where chemically assisted ion beam etching is adopted, the chemically assisted ion beam etching is similar to the ion beam etching described above, and the difference resides in that an un-ionized reactive gas is introduced near the semiconductor device 200, so that inert species from the ionized inert gas interact with the reactive gas near the semiconductor device 200, which causes a chemical reaction and this reaction results in removal of materials.

Figure 10:
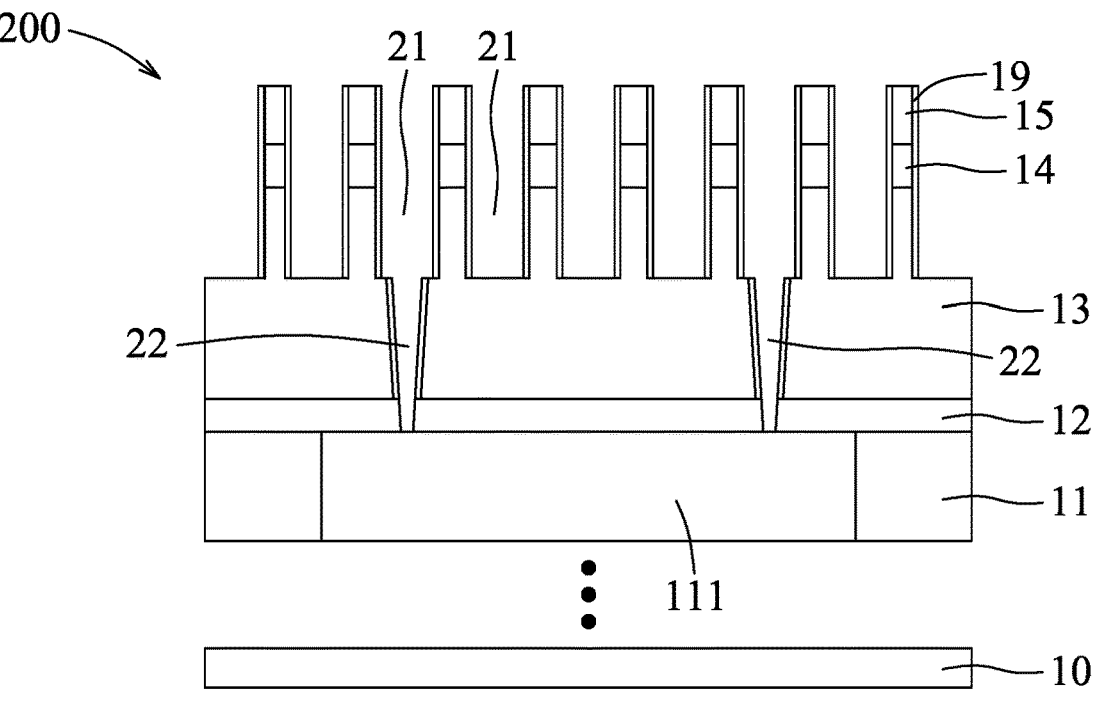
Figure 11:
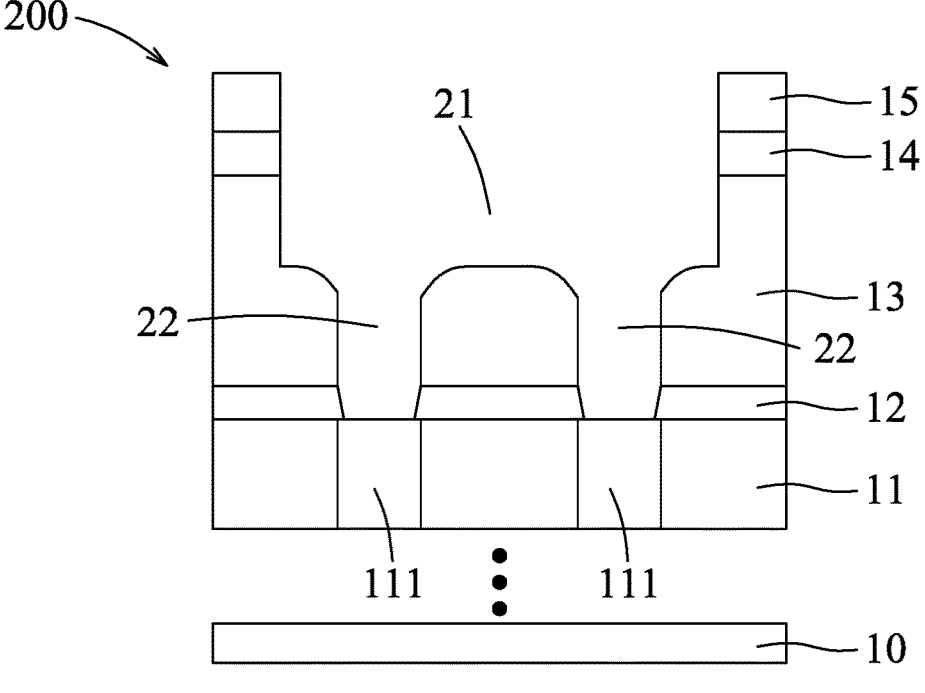
Figure 12:
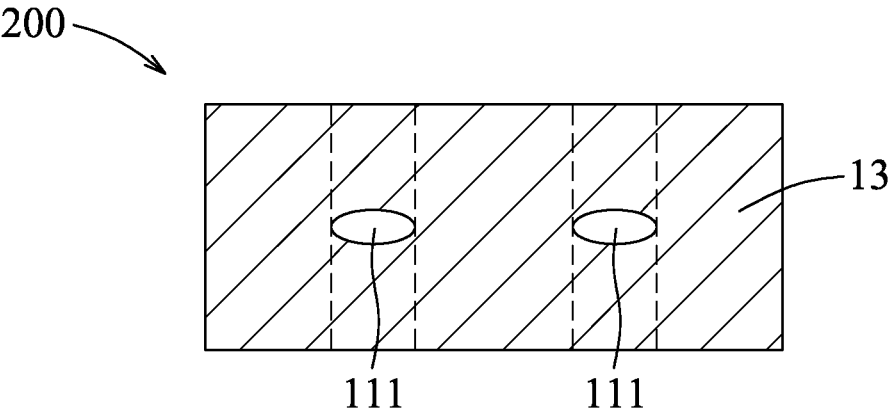

Referring to FIG. 1 and the example illustrated in FIGS. 10 to 12, the method 100 then proceeds to step 106, where a portion of the etch stop layer exposed through the at least one via opening is removed. In some embodiments, the portions of the etch stop layer 12 exposed through the via openings 22 and the corresponding ones of the trenches 21 are removed using a suitable etching process, for example, but not limited to, a wet etching process, a dry etching process, a reactive ion etching process, a neutral beam etching process, or the like. After the portions of the etch stop layer 12 are removed, portions of the at least one metal line 111 are exposed through the via openings 22 and the corresponding ones of the trenches 21. In some embodiments, a plasma etching process may be used to remove the portions of the etch stop layer 12, and a plasma source used for the plasma etching process may be inductively coupled plasma (ICP), capacitively coupled plasma (CCP), remote plasma, or the like. During the plasma etching process, an etch gas may include, for example, but not limited to, $CH_4$, $CH_3F$, $CH_2F_2$, $CHF_3$, $C_4F_8$, $C_4F_6$, $CF_4$, $H_2$, $HBr$, $O_2$, or the like, an additive gas may include, for example, but not limited to $CO$, $CO_2$, $O_2$, $N_2$, $He$, $Ne$, $Ar$, or the like, a process pressure may be set to be in a range from about 0.2 millitorrs to about 120 millitorrs, a process temperature may be set to be in a range from about 0° C. to about 100° C., a process power may be set to be in a range from about 0 watts to about 3000 watts, and a process bias voltage may be set to be in a range from about 0 volts to about 1200 volts. FIG. 10 is a schematic view illustrating a cross-section of the semiconductor device 200 obtained using the cutting plane of FIG. 4. FIG. 11 is a schematic view illustrating a cross-section of the semiconductor device 200 obtained using the cutting plane of FIG. 5. FIG. 12 is a cross-sectional top view illustrating a part of the semiconductor device 200. A left-right direction of FIG. 11 and a left-right direction of FIG. 12 are both the along-line direction. It is evident from the cross-sectional top view of FIG. 12 that the portions of the at least one metal line 111 (two metal lines 111 are exemplarily shown in FIGS. 11 and 12) exposed through the via openings 22 each have an oval shape, that is, the dimension of each of the via openings 22 in the along-line direction is enlarged while the dimension of each of the via openings 22 in the cross-line direction is kept unchanged.

Figure 13:
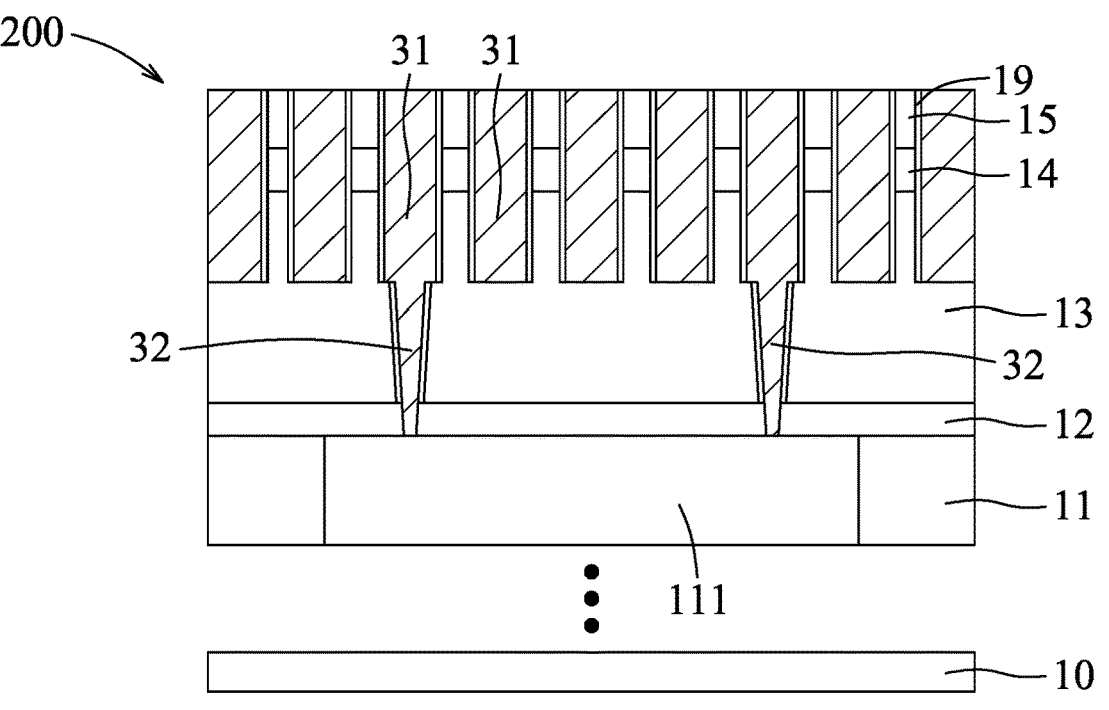
Figure 14:
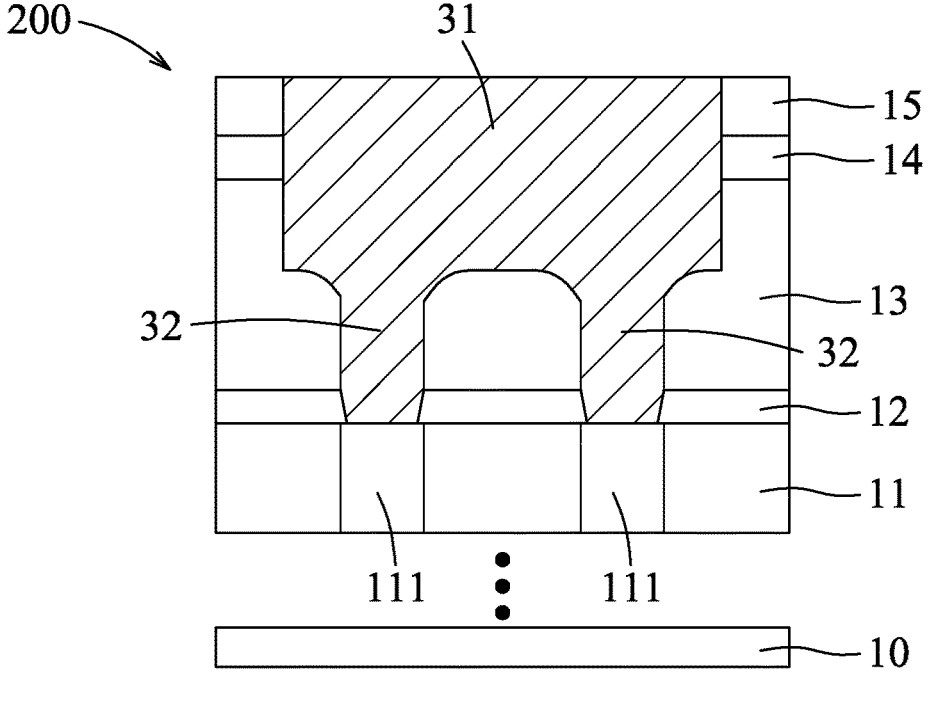

Referring to FIG. 1 and the example illustrated in FIGS. 13 and 14, the method 100 then proceeds to step 107, where at least one conductive line and at least one via contact are formed in the at least one trench and the at least one via opening, respectively. In some embodiments, a metal material is filled into the trenches 21 and the via openings 22 by a suitable deposition process as is known to those skilled in the art of semiconductor fabrication, for example, selective or non-selective PVD, selective or non-selective CVD, selective or non-selective PECVD, selective or non-selective ALD, selective or non-selective PEALD, ELD, ECP, or the like, and a planarization treatment (e.g., CMP) is then performed to remove excess of the metal material over the mask layer 15 so as to form a plurality of conductive lines 31 and a plurality of via contacts 32 (two via contacts 32 are exemplarily shown in FIG. 13). The via contacts 32 are disposed in a lower portion of the first dielectric layer 13 and the etch stop layer 12. The via contacts 32 are electrically connected to the metal line 111 in the interconnect layer 11. In some embodiments, each of the via contacts 32 having a first dimension in a first direction (e.g., the along-line direction) greater than a second dimension in a second direction (e.g., the cross-line direction), wherein the first direction and the second direction are perpendicular to each other and both are perpendicular to a longitudinal direction of the via contact 32. The conductive lines 31 are disposed in the mask layer 15, the second dielectric layer 14 and an upper portion of the first dielectric layer 13. Referring to the example shown in FIG. 13, which is a schematic view illustrating a cross-section of the semiconductor device 200 obtained using the cutting plane of FIG. 4, two of the conductive lines 31 are respectively and electrically connected to the two via contacts 32, and are electrically connected to the metal line 111 through the two via contacts 32, respectively. FIG. 14 is a schematic view illustrating a cross-section of the semiconductor device 200 obtained using the cutting plane of FIG. 5.

In some embodiments, the metal material may include, for example, but not limited to, metals (e.g., copper (Cu), silver (Ag), gold (Au), aluminum (Al), nickel (Ni), cobalt (Co), ruthenium (Ru), iridium (Ir), platinum (Pt), palladium (Pd), osmium (Os), tungsten (W), molybdenum (Mo), tantalum (Ta), or the like), alloys thereof possessing promising conductive properties, or the like. Other suitable metal materials are within the contemplated scope of the present disclosure. The deposition process for forming the at least one conductive line and the at least one via contact may be performed at a temperature ranging from about 25° C. to about 1000° C. If the temperature of the deposition process is higher than 1000° C., the materials and the components disposed proximate to the at least one conductive line and the at least one via contact may be damaged.

In some embodiments, before filling the metal material into the at least one trench and the at least one via opening, a metal barrier layer (not shown) and a metal liner layer (not shown) may be conformally and sequentially formed in the at least one trench and the at least one via opening. The metal barrier layer may be conformally formed by a suitable deposition process as is known to those skilled in the art of semiconductor fabrication, for example, PVD, CVD, PECVD, ALD, PEALD, or the like. The metal barrier layer may include, for example, but not limited to, cobalt, ruthenium, tungsten, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, tantalum, tantalum nitride, tantalum silicon nitride, tantalum oxide, tantalum silicon oxide, titanium nitride, titanium silicon nitride, titanium oxide, titanium silicon oxide, or combinations thereof. Other suitable metal barrier materials are within the contemplated scope of the present disclosure. The metal liner layer may then be conformally formed on the metal barrier layer by a suitable deposition process as is known to those skilled in the art of semiconductor fabrication, for example, PVD, CVD, PECVD, ALD, PEALD, or the like. In some embodiments, the metal liner layer may include, for example, but not limited to, metals (e.g., Cu, Ag, Au, Al, Ni, Co, Ru, Ir, Pt, Pd, Os, W, Mo, Ta, or the like), alloys of the metals, the nitride, carbide, silicide compounds of the metals, or the like, or combinations thereof. Other suitable metal liner materials are within the contemplated scope of the present disclosure.

Figure 15:
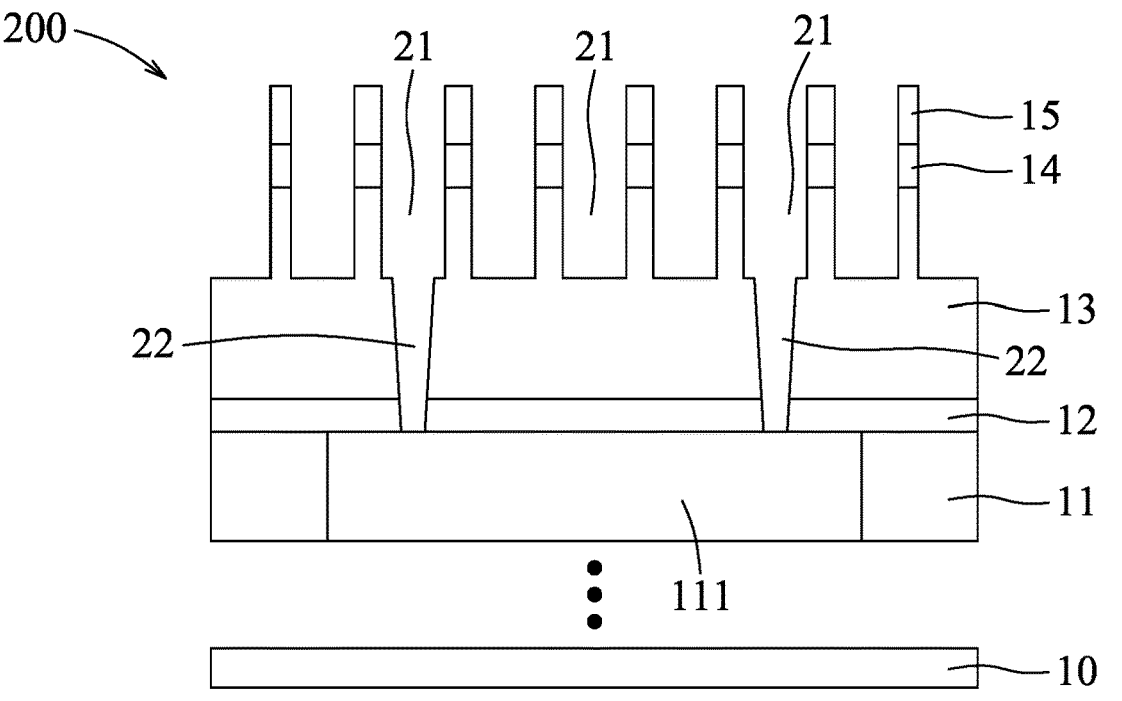
FIGS. 15 to 17 is are schematics view illustrating some intermediate stages of a manufacturing method in accordance with some alternative embodiments.
Figure 16:
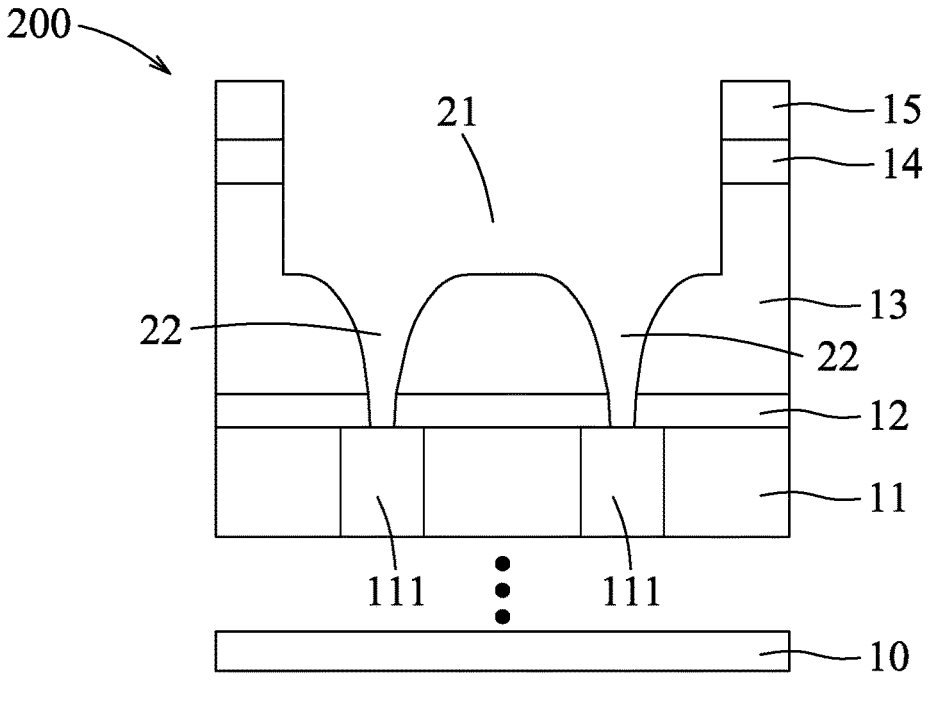
Figure 17:
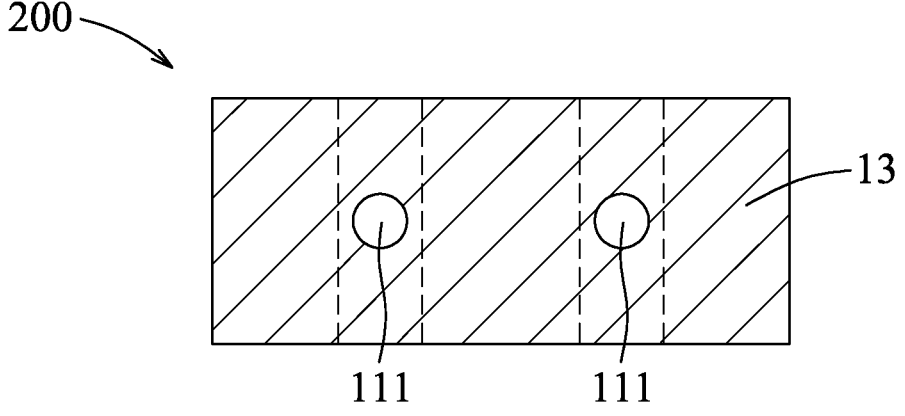
Figure 18:
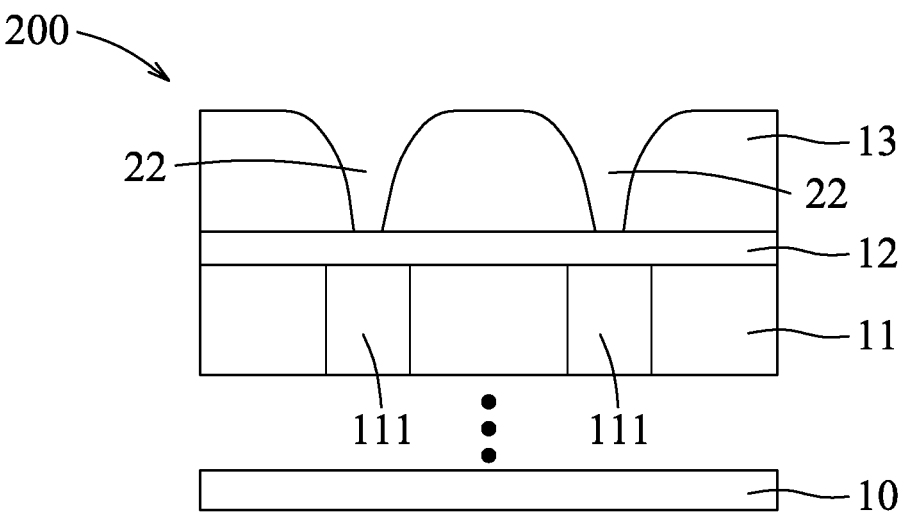
FIGS. 18 to 23 are schematic views illustrating some intermediate stages of a manufacturing method in accordance with some alternative embodiments.

Referring to FIG. 1 and the example illustrated in FIGS. 15 to 17, in some alternative embodiments where step 104 of forming another dielectric layer and step 105 of performing a directional etching process to enlarge the at least one via opening in a specific direction are skipped, step 106 of removing a portion of the etch stop layer exposed through the at least one via opening is performed immediately following formation of the at least one trench and the at least one via opening in step 103 (see FIGS. 4 and 5). FIG. 15 is a schematic view illustrating a cross-section of the semiconductor device 200 obtained using the cutting plane of FIG. 4. FIG. 16 is a schematic view illustrating a cross-section of the semiconductor device 200 obtained using the cutting plane of FIG. 5. FIG. 17 is a cross-sectional top view illustrating a part of the semiconductor device 200. A left-right direction of FIG. 16 and a left-right direction of FIG. 17 are both the along-line direction. Because the directional etching process is not performed, the dimension of each of the via openings 22 in the along-line direction is kept unchanged as shown in FIG. 16. It is evident from the cross-sectional top view of FIG. 17 that each of the portions of the metal lines 111 exposed through the via openings 22 has a circular shape, that is, the dimensions of each of the via openings in both the along-line direction and the cross-line direction are kept unchanged. In contrast, the portions of the metal lines 111 exposed through the via openings 22 have the oval shapes as shown in FIG. 12 because of the directional etching process enlarging the via openings 22 in the along-line direction, and therefore larger contact areas are able to be provided between the via contacts 32 and the metal lines 111. In this way, electrical resistance of contacting interfaces (referred to as contact resistance) between the via contacts and the metal lines can be decreased in the example shown in FIG. 12 in comparison with the example shown in FIG. 17.

Referring to the examples illustrated in FIGS. 18 to 23, in some alternative embodiments, the at least one conductive line and the at least one via contact may be formed using two single damascene processes. FIGS. 18 to 23 are schematic views illustrating cross-sections of the semiconductor device 200 obtained using the cutting plane of FIG. 5 at some intermediate stages of the manufacturing method.

The at least one via opening (two via openings 22 are exemplarily shown in FIG. 18) is formed by patterning the first dielectric layer 13 using one or more etching processes (for example, a dry etching process, a wet etching process, or a combination thereof) through a pattern of openings formed in a patterned mask layer (not shown), so as to expose portions of the etch stop layer 12 through the via openings 22, respectively.

Figure 19:
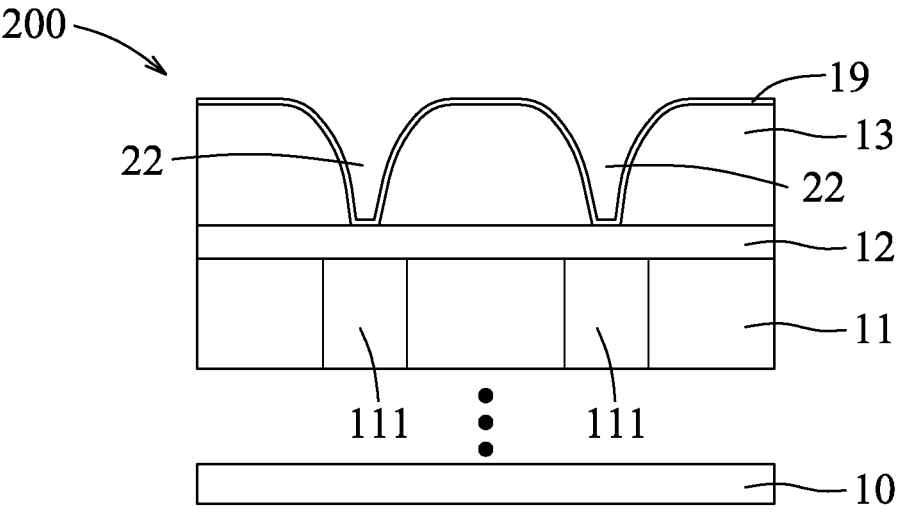
Figure 20:
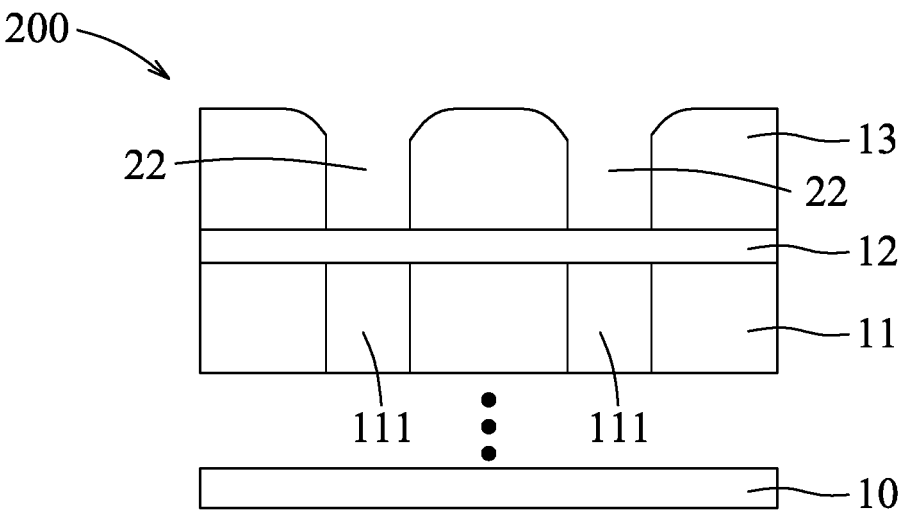
Figure 21:
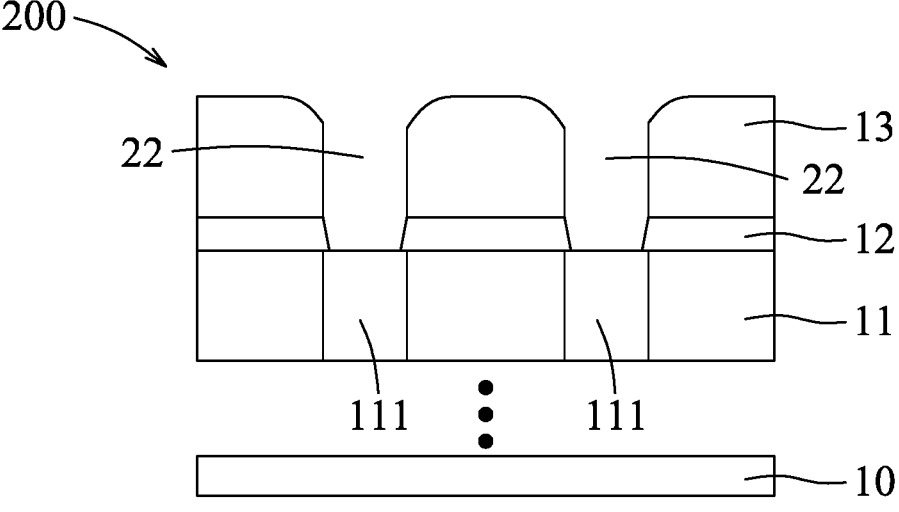
Figure 22:
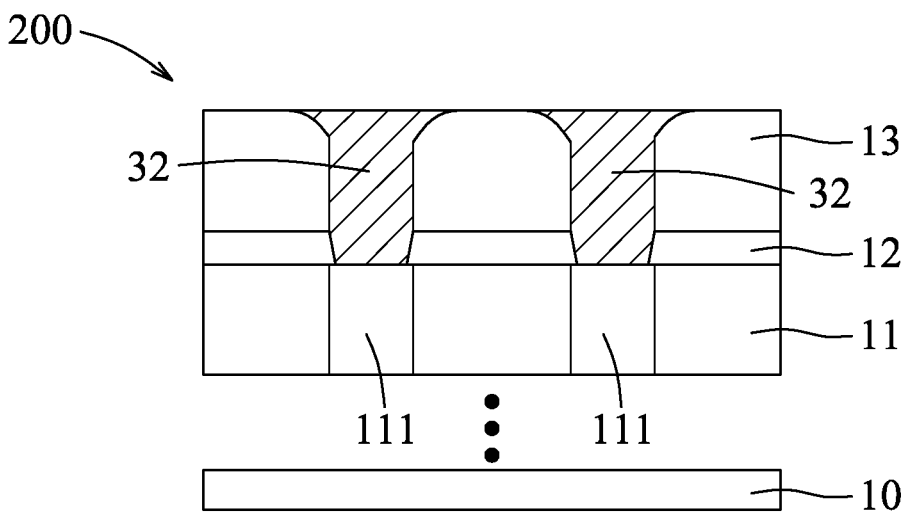
Figure 23:
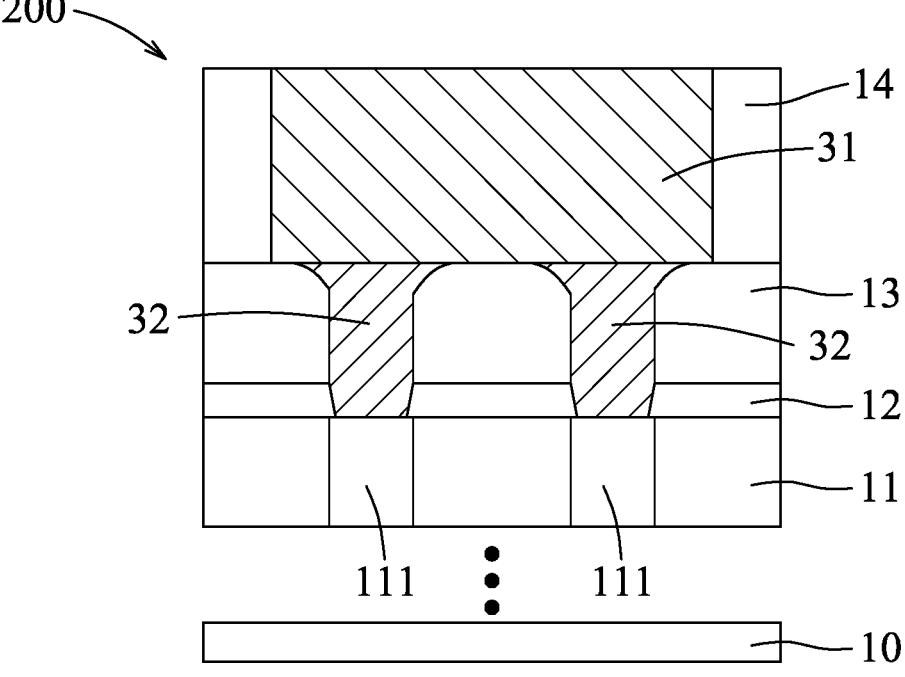

Then, as shown in FIG. 19, the third dielectric layer 19 is conformally formed on the first dielectric layer 13 and the portions of the etch stop layer 12 by a suitable deposition process as is known in the art of semiconductor fabrication, such as CVD, ALD, or the like. In this way, sidewalls of the first dielectric layer 13 which border the via openings 22 are covered by the third dielectric layer 19.

Subsequently, the directional etching process (e.g., the ion beam etching, the reactive ion beam etching or the chemically assisted ion beam etching) is performed to enlarge the via openings 22 in the along-line direction. In some embodiments, portions of the third dielectric layer 19 that correspond in position to the trenches 21 and the via openings 22, and that extend in the along-line direction are removed and portions of the sidewalls of the first dielectric layer 13 that border the via openings 22 in the along-line direction are etched back through the directional etching process, so that the dimension of each of the via openings 22 in the along-line direction is enlarged.

Next, the portions of the etch stop layer 12 exposed through the via openings 22 are removed using a suitable etching process, for example, but not limited to, a wet etching process, a dry etching process, a reactive ion etching process, a neutral beam etching process, or the like. After the portions of the etch stop layer 12 are removed, portions of the metal lines 111 are exposed through the via openings 22.

Then, a metal material is filled into the via openings 22, and a planarization treatment (e.g., CMP) is then performed to remove excess of the metal material over the first dielectric layer 13 so as to form the via contacts 32 which are electrically connected to the metal lines 111.

The second dielectric layer 14 including at least one conductive line 31 is then formed on the first dielectric layer 13 and the via contacts 32. Formation of the at least one conductive line 31 may be conducted in the same or similar manner as those described above with respect to formation of the metal lines 111 in the interconnect layer 11, and the details thereof are omitted for the sake of brevity.

As a result, by means of the directional etching process performed in the method 100 for manufacturing the semiconductor device 200 using two single damascene processes, the dimension of each of the via openings 22 in the along-line direction can be enlarged, so larger contact areas can be provided between the metal lines 111 and the via contacts 32 which are subsequently formed in the via openings 22. In this way, the contact resistance between the via contacts 32 and the metal lines 111 can be decreased. In addition, after the at least one conductive line 31 is formed on the via contacts 32, since the sidewalls of the first dielectric layer 13 that border the via openings 22 are etched back in the along-line direction through the directional etching process, larger contact areas can also be provided between the via contacts 32 and the conductive line 31, which also decreases contact resistance between the via contacts 32 and the conductive line 31.

In the semiconductor device of the present disclosure, the third dielectric layer is formed on sidewalls of the second dielectric layer and the first dielectric layer which border the at least one trench and the at least one via opening. The directional etching process is then performed to remove portions of the third dielectric layer that correspond in position to the trenches and the via openings, and that extend in the along-line direction, and to etch back portions of the sidewalls of the first dielectric layer that border the at least one via opening in the along-line direction, so as to enlarge a dimension of the at least one via opening in the along-line direction. Because of the highly directional nature of the directional etching process and with the third dielectric layer serving as a buffer layer in the cross-line direction, portions of the sidewalls of the second dielectric layer and the first dielectric layer which border the at least one trench and the at least one via opening in the cross-line direction are intact, so that dimensions of the at least one trench and the at least one via opening in the cross-line direction are maintained. As a result, spacing between two adjacent conductive lines to be formed in two adjacent trenches can be maintained, which prevents bridging or short circuit of the two adjacent conductive lines. In addition, a contact area between a metal line and at least one via contact to be formed in the at least one via opening can be enlarged, which decreases contact resistance therebetween. This technique can be used in existing damascene processes, including a dual damascene process or two single damascene process. For the case where two single damascene processes are adopted, contact resistance between the conductive line and the at least one via contact can also be decreased. Additionally, this technique can be used in any manufacturing process where enlargement of a dimension of a via opening in a specific direction is desired.

In accordance with some embodiments of the present disclosure, a semiconductor device includes a substrate, an interconnect layer disposed over the substrate and including a metal line, and a dielectric layer disposed on the interconnect layer and including a via contact. The via contact is electrically connected to the metal line and having a first dimension in a first direction greater than a second dimension in a second direction, the first direction and the second direction being perpendicular to each other and both are perpendicular to a longitudinal direction of the via contact.

In accordance with some embodiments of the present disclosure, a cross section of the via contact transverse to the longitudinal direction has an oval shape.

In accordance with some embodiments of the present disclosure, the dielectric layer further includes a conductive line which is disposed on the via contact and which is electrically connected to the metal line through the via contact In accordance with some embodiments of the present disclosure, the conductive line extends in the first direction.

In accordance with some embodiments of the present disclosure, the dielectric layer directly borders the conductive line in the first direction.

In accordance with some embodiments of the present disclosure, the semiconductor device further includes another dielectric layer which laterally covers the conductive line in the second direction.

In accordance with some embodiments of the present disclosure, the dielectric layer is spaced apart from the conductive line by the another dielectric layer in the second direction.

In accordance with some embodiments of the present disclosure, the dielectric layer directly borders the via contact in the first direction.

In accordance with some embodiments of the present disclosure, the semiconductor device further includes another dielectric layer which laterally covers the via contact in the second direction.

In accordance with some embodiments of the present disclosure, the dielectric layer is spaced apart from the via contact by the another dielectric layer in the second direction.

In accordance with some embodiments of the present disclosure, a semiconductor device includes a substrate, an interconnect layer disposed over the substrate and including a metal line, a dielectric layer disposed over the interconnect layer, a via contact disposed in a lower portion of the dielectric layer, and a plurality of conductive lines disposed in an upper portion of the dielectric layer. The via contact electrically interconnects one of the conductive lines and the metal line. The conductive lines extend in an along-line direction and are spaced apart from each other in a cross-line direction that is transverse to the along-line direction. The via contact has a dimension in the along-line direction greater than a dimension of the via contact in the cross-line direction.

In accordance with some embodiments of the present disclosure, the semiconductor device further includes another dielectric layer which is disposed on a lateral side of the via contact in the cross-line direction such that the dielectric layer is spaced apart from the via contact by the another dielectric layer in the cross-line direction.

In accordance with some embodiments of the present disclosure, the dielectric layer directly contacts the via contact in the along-line direction.

In accordance with some embodiments of the present disclosure, the semiconductor device further includes another dielectric layer which is disposed on a lateral side of one of the conductive lines in the cross-line direction such that the dielectric layer is spaced apart from the one of the conductive lines by the another dielectric layer in the cross-line direction.

In accordance with some embodiments of the present disclosure, the semiconductor device further includes an etch stop layer which is disposed between the interconnect layer and the dielectric layer. The via contact extends through the etch stop layer to connect to the metal line.

In accordance with some embodiments of the present disclosure, a method for manufacturing a semiconductor device includes forming a first dielectric layer over an interconnect layer, wherein the interconnect layer is disposed over a substrate and including a metal line, patterning the first dielectric layer to form a via opening which is disposed over the metal line, etching back a sidewall of the first dielectric layer that borders the via opening in a specific direction using a directional etching process to enlarge a dimension of the via opening in the specific direction, and forming a via contact in the via opening.

In accordance with some embodiments of the present disclosure, the directional etching process used to enlarge the dimension of the via opening in the specific direction includes one of ion beam etching, reactive ion beam etching, chemically assisted ion beam etching and combinations thereof.

In accordance with some embodiments of the present disclosure, the method further includes patterning, prior to etching back the sidewall of the first dielectric layer, the first dielectric layer to form a trench that extends in the specific direction and that is disposed over the via opening, wherein the trench is in spatial communication with the via opening, and forming, subsequent to etching back the sidewall of the first dielectric layer, a conducive line in the trench. The via contact and the conductive line are formed using a dual damascene process.

In accordance with some embodiments of the present disclosure, the method further includes, subsequent to forming a via contact in the via opening, forming a second dielectric layer on the first dielectric layer which is formed with the via contact, patterning the second dielectric layer to form a trench which extends in the specific direction and which is disposed over the via contact, and forming a conductive line in the trench. The via contact and the conductive line are formed separately using two single damascene processes.

In accordance with some embodiments of the present disclosure, the method further includes, prior to etching back the sidewall of the first dielectric layer, forming a third dielectric layer on the first dielectric layer so that the sidewall of the first dielectric layer that borders the via opening is covered by the third dielectric layer.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a substrate;
an interconnect layer disposed over the substrate and including a metal line;
a dielectric layer disposed on the interconnect layer and including a via contact, the via contact being electrically connected to the metal line and having a first dimension in a first direction greater than a second dimension in a second direction, the first direction and the second direction being perpendicular to each other and both being perpendicular to a longitudinal direction of the via contact, the metal line extending in the second direction; and
another dielectric layer laterally covering an upper portion of the via contact in the second direction, so that a lower portion of the via contact is uncovered by the another dielectric layer;
wherein the via contact interfaces the dielectric layer in the first direction, and is spaced apart from the dielectric layer by the another dielectric layer in the second direction.

2. The semiconductor device according to claim 1, wherein a cross section of the via contact transverse to the longitudinal direction has an oval shape.

3. The semiconductor device according to claim 1, wherein the dielectric layer further includes a conductive line which is disposed on the via contact and which is electrically connected to the metal line through the via contact.

4. The semiconductor device according to claim 3, wherein the conductive line extends in the first direction.

5. The semiconductor device according to claim 4, wherein the dielectric layer directly borders the conductive line in the first direction.

6. The semiconductor device according to claim 4, further comprising another dielectric layer which laterally covers the conductive line in the second direction.

7. The semiconductor device according to claim 6, wherein the dielectric layer is spaced apart from the conductive line by the another dielectric layer in the second direction.

8. A semiconductor device comprising:
a substrate;
an interconnect layer disposed over the substrate, and including a metal line;
a dielectric layer disposed over the interconnect layer;
an etch stop layer disposed between the interconnect layer and the dielectric layer:
a via contact disposed in a lower portion of the dielectric layer;
a plurality of conductive lines disposed in an upper portion of the dielectric layer, the via contact electrically interconnecting the metal line and one of the conductive lines, the conductive lines extending in an along-line direction and being spaced apart from each other in a cross-line direction that is transverse to the along-line direction, the via contact having a dimension in the along-line direction greater than a dimension of the via contact in the cross-line direction; and
another dielectric layer disposed on a lateral side of the via contact in the cross-line direction;
wherein the via contact interfaces the dielectric layer in the along-line direction, and is spaced apart from the dielectric layer by the another dielectric layer in the cross-line direction, the another dielectric layer including a material different from a material of the dielectric layer, and
wherein an interface between an upper portion of the via contact and the dielectric layer is misaligned with another interface between a lower portion of the via contact and the etch stop layer in the along-line direction.

9. The semiconductor device according to claim 8, wherein the another dielectric layer is disposed on a lateral side of one of the conductive lines in the cross-line direction such that the dielectric layer is spaced apart from the one of the conductive lines by the another dielectric layer in the cross-line direction.

10. A semiconductor device comprising:

a metal line that is located on a lower plane and that extends in a cross-line direction;

a conductive line that is located on an upper plane located over the lower plane and that extends in an along-line direction not parallel to the cross-line direction;

a via contact that is located between the lower plane and the upper plane, and that electrically interconnects the metal line and the conductive line, a projection of the via contact from the upper plane onto the lower plane having a shape of an ellipse that has a major axis extending in the along-line direction and a minor axis extending in the cross-line direction;

a dielectric layer that is located between the upper plane and the lower plane, and that surrounds the via contact; and another dielectric layer that is formed on sidewalls of the via contact in the cross-line direction and that is disposed between the via contact and the dielectric layer in the cross-line direction;

wherein the via contact adjoins the dielectric layer in the along-line direction, and is spaced apart from the dielectric layer by the another dielectric layer in the cross-line direction, wherein a bottom surface of the another dielectric layer is higher than a bottom surface of the via contact.

11. The semiconductor device according to claim 10, further comprising:

an etch stop layer that is disposed over the metal line and that is disposed below the dielectric layer and the another dielectric layer, the via contact extending through the etch stop layer to be in electrical contact with the metal line.

12. The semiconductor device according to claim 10, wherein:

the conductive line is bordered by the dielectric layer in the along-line direction, and is bordered by the another dielectric layer in the cross-line direction.

13. The semiconductor device according to claim 1, wherein:

the another dielectric layer includes one of silicon nitride, silicon nitride doped with carbon, silicon oxide, silicon oxynitride, silicon oxynitride doped with carbon, silicon carbide, silicon oxycarbide, aluminum oxide, aluminum nitride, aluminum oxynitride, and combinations thereof.

14. The semiconductor device according to claim 1, wherein:

the another dielectric layer is inclined with respect to the longitudinal direction of the via contact.

15. The semiconductor device according to claim 8, wherein:

the another dielectric layer includes one of silicon nitride, silicon nitride doped with carbon, silicon oxide, silicon oxynitride, silicon oxynitride doped with carbon, silicon carbide, silicon oxycarbide, aluminum oxide, aluminum nitride, aluminum oxynitride, and combinations thereof.

16. The semiconductor device according to claim 8, wherein the another dielectric layer is inclined with respect to a longitudinal direction of the via contact.

17. The semiconductor device according to claim 16, wherein a cross section of the via contact transverse to the longitudinal direction has an oval shape.

18. The semiconductor device according to claim 10, wherein the another dielectric layer includes one of silicon nitride, silicon nitride doped with carbon, silicon oxide, silicon oxynitride, silicon oxynitride doped with carbon, silicon carbide, silicon oxycarbide, aluminum oxide, aluminum nitride, aluminum oxynitride, and combinations thereof.

19. The semiconductor device according to claim 10, wherein the another dielectric layer is inclined with respect to a longitudinal direction of the via contact.

20. The semiconductor device according to claim 1, further comprising an etch stop layer disposed between the interconnect layer and the dielectric layer, wherein an interface between the upper portion of the via contact and the dielectric layer and another interface between the lower portion of the via contact and the etch stop layer in the along-line direction define an included angle which is an obtuse angle.

* * * * *